(12) United States Patent
Greene et al.

(10) Patent No.: US 7,424,431 B2
(45) Date of Patent: Sep. 9, 2008

(54) SYSTEM, METHOD AND COMPUTER PROGRAM PRODUCT FOR ADDING VOICE ACTIVATION AND VOICE CONTROL TO A MEDIA PLAYER

(75) Inventors: Mark Greene, San Jose, CA (US); Michael Hegarty, Sunnyvale, CA (US); Dermot Cantwell, Sunnyvale, CA (US)

(73) Assignee: Stragent, LLC, San Jose, CA (US)

( * ) Notice: Subject to any disclaimer, the term of this patent is extended or adjusted under 35 U.S.C. 154(b) by 254 days.

(21) Appl. No.: 11/281,964

(22) Filed: Nov. 16, 2005

(65) Prior Publication Data

US 2007/0011007 A1    Jan. 11, 2007

Related U.S. Application Data

(60) Provisional application No. 60/698,595, filed on Jul. 11, 2005.

(51) Int. Cl.
*G10L 15/22* (2006.01)
*H04H 20/48* (2008.01)
*H04H 40/45* (2008.01)

(52) U.S. Cl. .............................. 704/270; 704/275; 381/3
(58) Field of Classification Search ................. 704/270, 704/270.1, 275; 381/3, 122
See application file for complete search history.

(56) References Cited

U.S. PATENT DOCUMENTS

| | | | | |
|---|---|---|---|---|
| 5,721,783 A * | 2/1998 | Anderson | .................... | 381/328 |
| 5,774,859 A * | 6/1998 | Houser et al. | ................ | 704/275 |
| 5,930,751 A * | 7/1999 | Cohrs et al. | ................ | 704/231 |
| 6,192,340 B1 * | 2/2001 | Abecassis | .................... | 704/270 |
| 6,505,159 B1 * | 1/2003 | Theodore | .................... | 704/270 |
| 6,591,085 B1 | 7/2003 | Grady | | |
| 6,598,018 B1 * | 7/2003 | Junqua | ........................ | 704/251 |
| 6,882,286 B1 * | 4/2005 | Yamamoto | ............. | 340/825.69 |
| 6,965,863 B1 * | 11/2005 | Zuberec et al. | ............. | 704/270 |
| 6,993,615 B2 * | 1/2006 | Falcon | ........................ | 710/303 |
| 2003/0187657 A1 * | 10/2003 | Erhart et al. | ............. | 704/270.1 |
| 2004/0058649 A1 | 3/2004 | Grady | ........................ | 455/42 |
| 2004/0171346 A1 | 9/2004 | Lin | ............................. | 455/3.05 |
| 2004/0176959 A1 * | 9/2004 | Wilhelm et al. | ............. | 704/275 |
| 2005/0014536 A1 | 1/2005 | Grady | | |

(Continued)

FOREIGN PATENT DOCUMENTS

WO    WO 2006/081692    8/2006

(Continued)

OTHER PUBLICATIONS

"PodBuddy FM: FM Car Connection System For Apple's iPod" http://www.dvforge.com/podbuddy.shtml, Copyright © 2005 DVForge, Inc.

(Continued)

*Primary Examiner*—Martin Lerner
(74) *Attorney, Agent, or Firm*—Zilka-Kotab, PC

(57) ABSTRACT

A media player system, method and computer program product are provided. In use, an utterance is received. A command for a media player is then generated based on the utterance. Such command is utilized for providing wireless control of the media player.

63 Claims, 8 Drawing Sheets

U.S. PATENT DOCUMENTS

| | | |
|---|---|---|
| 2005/0015254 A1 | 1/2005 | Beaman |
| 2005/0049015 A1 | 3/2005 | Wang |
| 2006/0089754 A1 | 4/2006 | Mortenson |
| 2006/0206339 A1 | 9/2006 | Silvera et al. |
| 2006/0206340 A1 | 9/2006 | Silvera et al. |
| 2007/0192109 A1 | 8/2007 | Likens et al. |

FOREIGN PATENT DOCUMENTS

| | | |
|---|---|---|
| WO | WO 2007/008248 | 1/2007 |

OTHER PUBLICATIONS

International Search Report and Written Opinion from PCT Application No. PCT/US2005/041640 which was mailed on Oct. 17, 2007.

U.S. Appl. No. 60/665,326 which was filed on Mar. 23, 2005.

International Preliminary Report on Patentability from PCT Application No. PCT/US2005/041640 which was mailed on Jan. 16, 2008.

* cited by examiner

SYSTEM, METHOD AND COMPUTER PROGRAM PRODUCT FOR ADDING VOICE ACTIVATION AND VOICE CONTROL TO A MEDIA PLAYER

RELATED APPLICATION(S)

The present application claims priority of a provisional application filed Jul. 11, 2005 under Ser. No. 60/698,595, which is incorporated herein by reference in its entirety for all purposes.

BACKGROUND AND FIELD OF THE INVENTION

The present invention relates to media players, and more particularly to controlling media players.

SUMMARY

A media player system, method and computer program product are provided. In use, an utterance is received. A command for a media player is then generated based on the utterance. Such command is utilized for providing wireless control of the media player.

DETAILED DESCRIPTION

Figure 1:
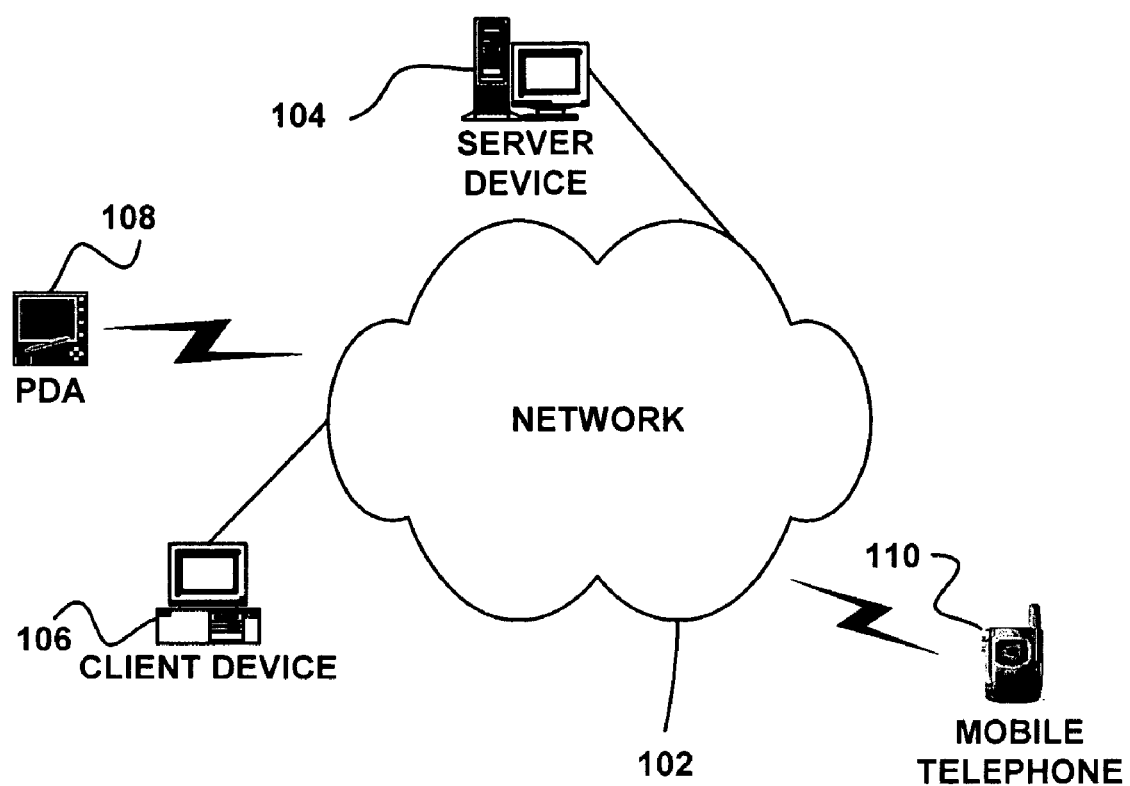
FIG. 1 illustrates a network architecture, in accordance with one embodiment.
Figure 1:

FIG. 1 illustrates a network architecture 100, in accordance with one embodiment. As shown, a network 102 is provided. In the context of the present network architecture 100, the network 102 may take any form including, but not limited to a telecommunications network, a local area network (LAN), a wireless network, a wide area network (WAN) such as the Internet, etc. While only one network is shown, it should be understood that two or more similar or different networks 102 may be provided.

Coupled to the network 102 is a plurality of devices. For example, a server device 104 and an end user computer 106 may be coupled to the network 102 for communication purposes. Such end user computer 106 may include a desktop computer, lap-top computer, and/or any other type of logic. Still yet, various other devices may be coupled to the network 102 including a media player 108, a mobile phone 110, etc.

It should be noted that any of the foregoing devices in the present network architecture 100, as well as any other unillustrated hardware and/or software, may be equipped with voice control of an associated media player. More exemplary information regarding such architecture and associated functionality will be set forth hereinafter in greater detail.

Figure 2:
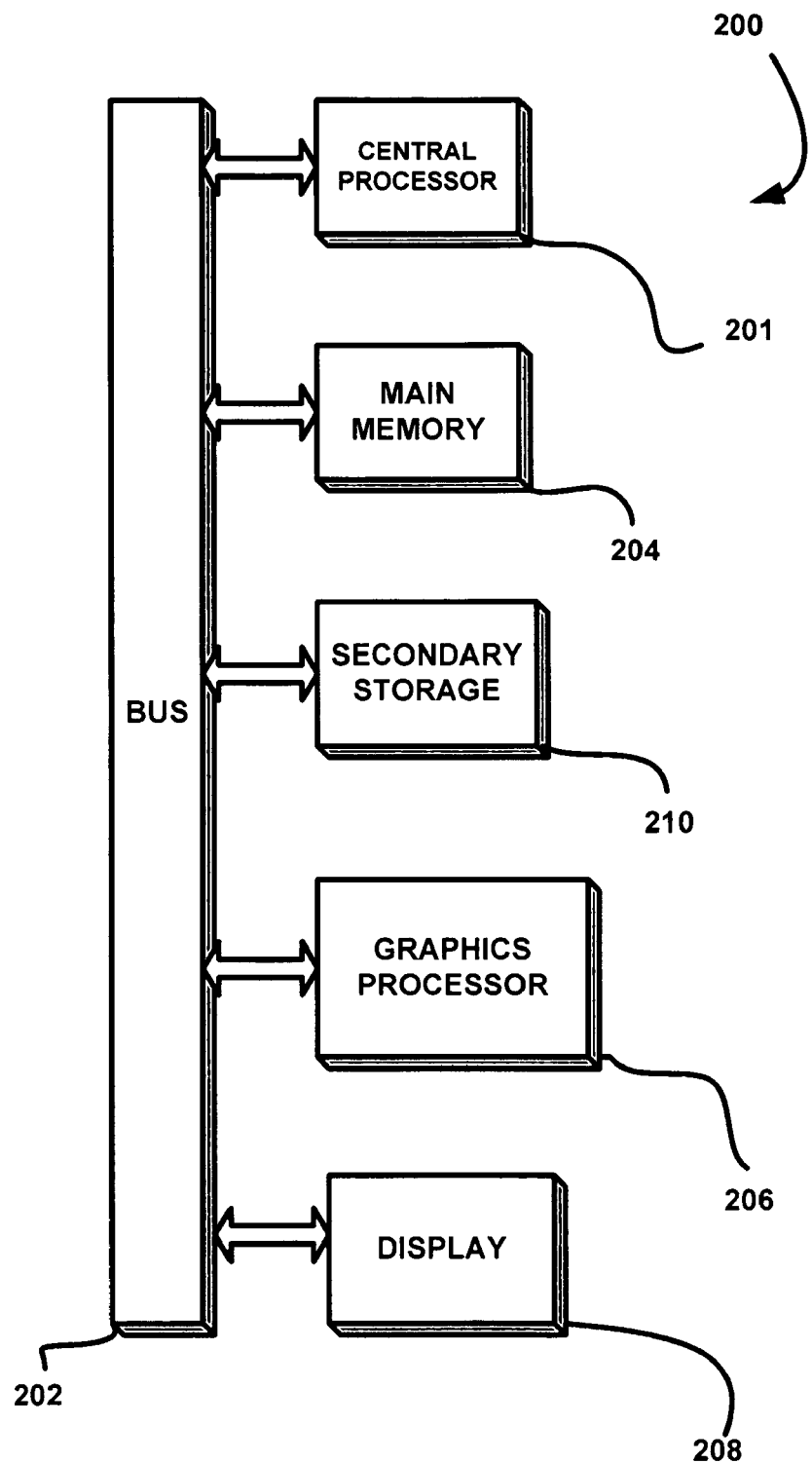
FIG. 2 shows a representative hardware environment that may be associated with the devices of FIG. 1, in accordance with one embodiment.

FIG. 2 illustrates an exemplary system 200, in accordance with one embodiment. As an option, the system 200 may be implemented in the context of any of the devices of the network architecture 100 of FIG. 1. Of course, the system 200 may be implemented in any desired environment.

As shown, a system 200 is provided including at least one central processor 201 which is connected to a communication bus 202. The system 200 also includes main memory 204 [e.g. random access memory (RAM), etc.]. The system 200 also includes an optional graphics processor 206 and a display 208.

The system 200 may also include a secondary storage 210. The secondary storage 210 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 204 and/or the secondary storage 210. Such computer programs, when executed, enable the system 200 to perform various functions. The memory 204, storage 210 and/or any other storage are possible examples of computer-readable media.

Figure 3:
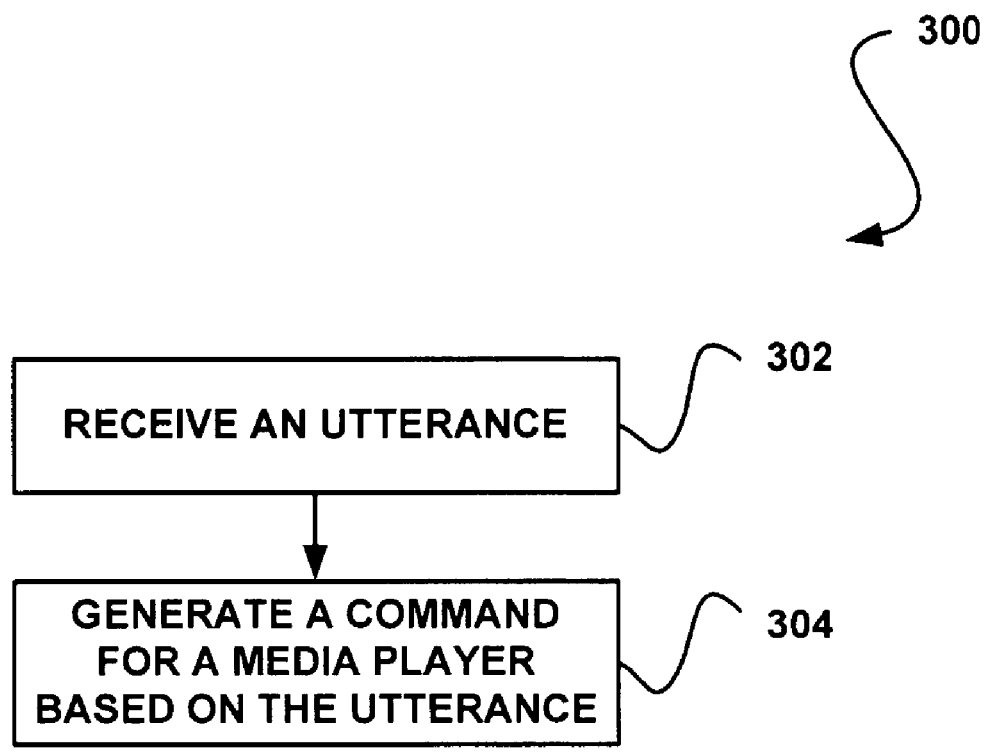
FIG. 3 shows a method for providing wireless control of a media player, in accordance with one embodiment.

FIG. 3 shows a method 300 for providing wireless control of a media player, in accordance with one embodiment. As an option, the present method 300 may be implemented in the context of the architecture and environment of FIGS. 1 and/or 2. Of course, however, the method 300 may be carried out in any desired environment.

Initially, an utterance is received, as shown in operation 302. The utterance may include any audible word, number, and/or sound capable of being received. Still yet, the utterance may be received by a microphone and/or any other desired input device capable of receiving the utterance. As an option, the utterance may be received utilizing an input device including an integrated microphone in a set of headphones which enables voice control in an active environment. As another option, the utterance may be received utilizing an input device including a wireless device which can be positioned for optimum voice control in an automobile, an indoor environment, and/or an outdoor environment.

Next, in operation 304, a command for a media player is then generated based on the utterance. In the context of the present description, a media player may include an iPod(R), a portable satellite radio player, and/or any portable software and/or hardware capable of outputting any sort of media [e.g. audible media (e.g. music, news, non-fiction information, fictional stories, etc.), visual media (e.g. pictures, video in the form of movies, news, programming, etc.), etc.].

Still yet, as an option, the media player may be used in conjunction (e.g. built-in, retrofitted with, coupled to, etc.) any desired device including, but not limited to a cellular phone, personal digital assistant, etc. (e.g. see, for example, any of the devices of FIG. 1, etc.). Of course, it is contemplated that the media player may further be a stand alone product.

Even still, the commands may include, for example, commands that operate the media player, commands that change states of the media player, etc. Specifically, for media players that play music, for example, such commands may include play, pause, fast forward, rewind, on, off, shuffle, repeat, search, volume up, volume down, playlist, next playlist, etc. As an example, the search command may provide a user with the ability to command the media player to search for a particular song or artist and the play command may provide the user with the ability to command a particular song to be played. In various embodiments, the commands may be programmable and/or registered by the media player. Of course, the command may include any signal, instruction, code, data, etc. that is capable of being utilized for providing wireless control of the media player. For example, the command may be an utterance that is translated into a hex code capable of being recognized by the media player. Table 1 illustrates examples of such hex codes capable of being recognized by the media player, in an embodiment where the media player includes the aforementioned iPod(R).

TABLE 1

Shuffle = FF 55 04 02 00 00 80 7A,
Pause = FF 55 03 02 00 01 FA
Playlist = FF 55 04 02 00 00 40 BA It should be noted that the operations of the method 300 of FIG. 3 may be carried out by the media player itself, and/or by way of a separate assembly that is either built-in the media player or capable of being retrofitted on the media player. One exemplary assembly will be described in more detail with respect to FIGS. 4-6.

More illustrative information will now be set forth regarding various optional architectures and features with which the foregoing method 300 may or may not be implemented, per the desires of the user. It should be strongly noted that the following information is set forth for illustrative purposes and should not be construed as limiting in any manner. Any of the following features may be optionally incorporated with or without the exclusion of other features described.

Figure 4:
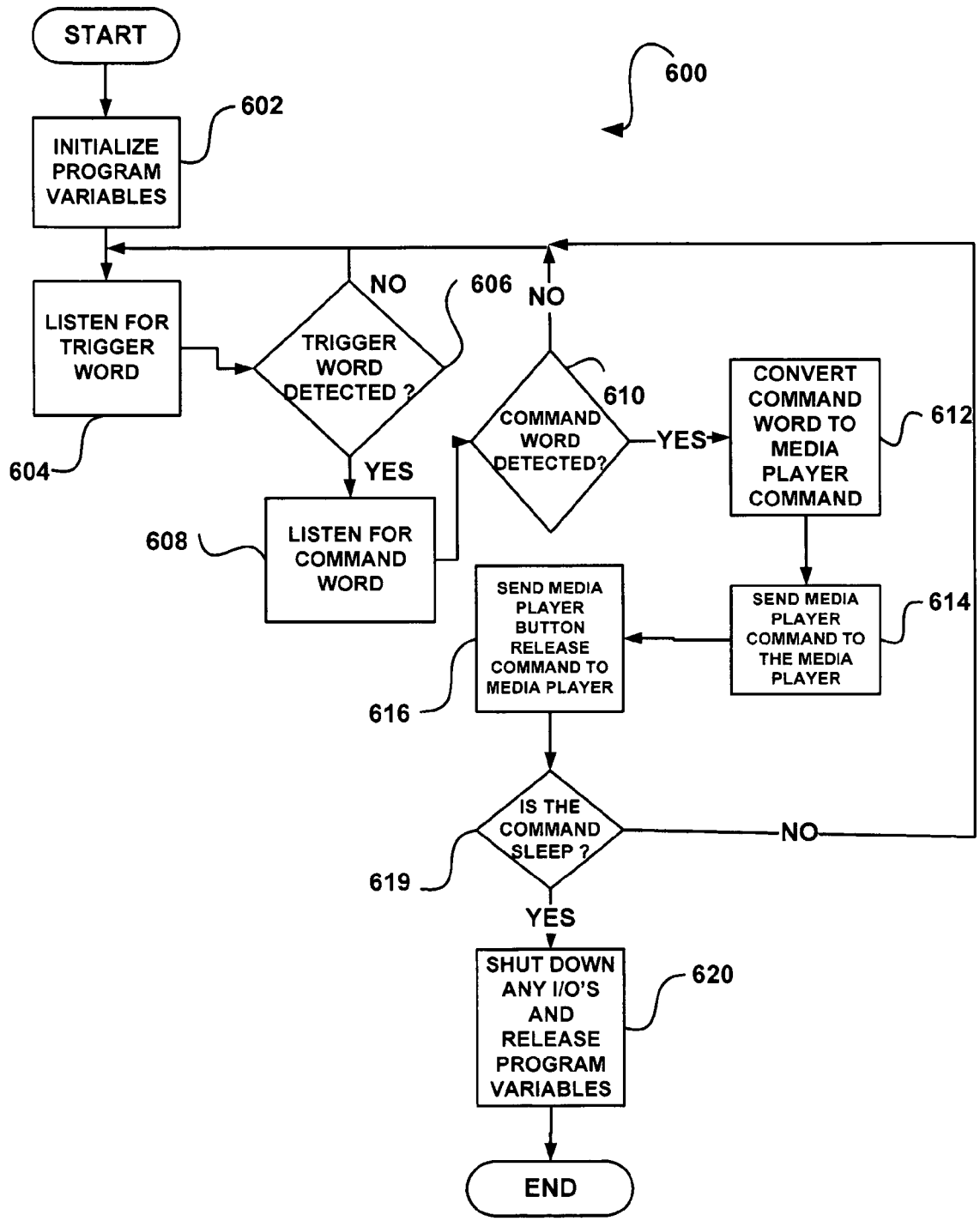
FIG. 4 shows a method for providing wireless control of a media player, in accordance with another embodiment.

FIG. 4 shows a method for providing wireless control of a media player, in accordance with another embodiment. As an option, the present method 600 may be implemented in the context of the architecture and environment of FIGS. 1-3. Of course, however, the method 600 may be carried out in any desired environment.

First, program variables within an assembly attached to a media player are initiated, as shown in operation 602. The program variables initialized may include initializing trigger and command words along with any input or output utilized. An exemplary assembly will be described in more detail with respect to FIGS. 5 and 6. Next, the assembly listens for a trigger word, as in operation 604. The trigger word may be any word capable of being recognized and understood by the assembly. It may also optionally be any word capable of initiating a voice recognition capability of the assembly. For example, a user may be required to first say "start" in order to trigger the assembly.

Once it is determined that a trigger word is detected, as in operation 606, a command word is awaited, such as in operation 608. As an option, the command word may include any of the utterances described with respect to FIG. 3. Of course the command word may include any word capable of being recognized by the assembly and capable of being translated into computer code that the media player can act upon. As another option, a time limit (e.g. 120 seconds, etc.) may be utilized such that if no trigger word is detected during operation 606 within the time limit, the method may return to operation 604.

Next, upon determination that a command word has been detected, as in operation 610, the command is converted into computer code that can be read by the media player, as shown in operation 612. As an example, in one embodiment, the computer code may include computer code that can be read by the personal media player. However, if a specified period of time expires in operation 608, the determination of operation 610 may be false (or be more scrutinized, etc.) and the method may return to operation 604. In addition, if a word is detected but it is not a registered or programmed command word, the method may also return to operation 608.

The computer code is then sent from the assembly to the media player, as shown in operation 614, and a send button releases the command to the media player, as in operation 616. Such send button may indicate to the media player that the computer code is complete. Further, the computer code may be sent as a bit stream to the media player. For example, the bit stream may consist of seven codes of ten bits each. Still yet, each bit may be sent approximately every 55 uSecs with a code repetition rate of 66 (i.e. each code is sent about every 15 milliseconds).

It is next determined whether the command is a sleep command, as shown in operation 619. For example, such command may be created by a user uttering "sleep" and such utterance then being translated into computer code that tells the media player to power down. If the determination in operation 619 is positive, the media player is powered down and all program variables are released, as depicted in operation 620. Powering down may, as an option, include setting the media player to a low power mode. Alternatively, if the command is not for the media player to sleep, the method 600 returns to operation 602 where it continues to listen for a trigger word. Again, method 600 is set forth to illustrate just one example of a method for wireless controlling a media player, and should not be construed as limiting in any manner.

Figure 5:
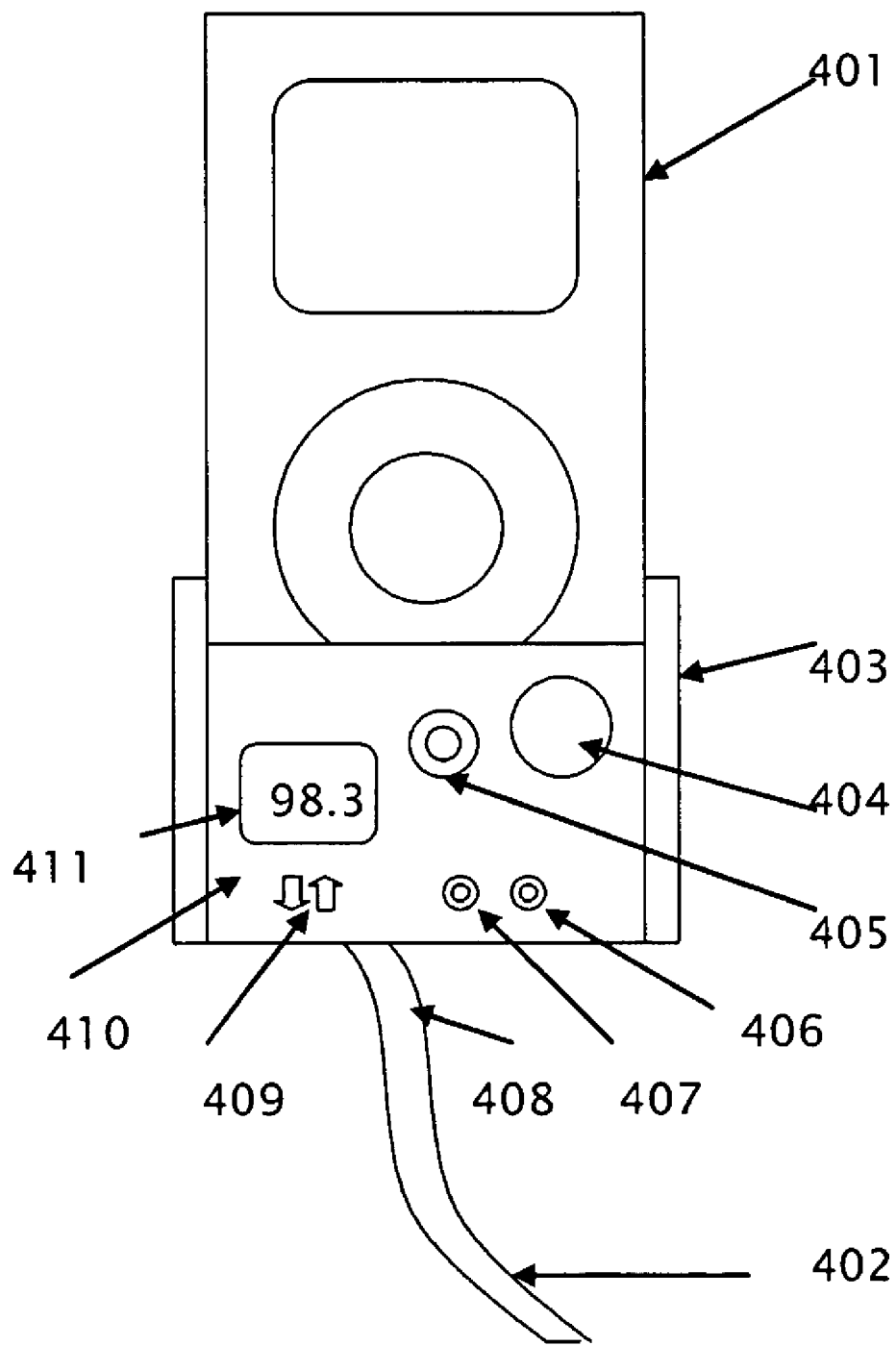
FIG. 5 shows a media player in connection with an assembly for receiving utterances, in accordance with another embodiment.

FIG. 5 shows a media player in connection with an assembly for receiving utterances, in accordance with another embodiment. As an option, the media player/assembly may be implemented in the context of the architecture and environment of FIGS. 1-4. Of course, however, the media player/assembly may be implemented in any desired environment.

A media player 401 is shown connected to an assembly 403. In the present embodiment, media player 401 is shown with the assembly 403 holding the media player 401. Of course such assembly 403 could be optionally mounted on the personal media player 401 or connected in any other manner. In any way, media player 401 is configured to connect to the assembly 403.

The assembly 403 includes electrical connection (not shown), voice activation software (not shown), voice activation hardware (not shown), a memory integrated circuit (not shown), an FM transmitter 409, and a power unit 402. The voice activation software may be capable of detecting an utterance, translating the utterance into computer code, and transmitting the code to the media player 401. In addition, the power unit 402 may be capable of charging the media player 401 and may include a plug that connects to an automobile cigarette lighter device or AC/DC converter device to provide a required voltage. Optionally, the connection may be located on the end of a flexible metal rod that supports the assembly.

The FM transmitter 409 may further include up and down arrows on the front of the assembly 403 as shown in FIG. 5 for sweeping across 88 MHz to 108 MHz such that a frequency that has little outside traffic may be locked in for transmitting a stereo signal at least six feet. FM transmitter 409 may also include left and right channel programming capabilities.

Additionally, a power LED 406 and charging LED 407 may be utilized for displaying whether the media player 401 is charging or listening for an utterance. Further included may be a verification speaker 404 for verifying utterances received, a directional microphone 405 for receiving and transferring utterances to a processing circuit (not shown) that translates the utterances into computer code capable of being read by the media player 401. The processing circuit may also include a voice engine, onboard memory, and a plurality of circuit peripherals.

In use, the utterance may be verified by replaying the utterance for the user who provided the utterance and allowing the user to either accept or reject the utterance. For example, in playing the utterance back for the user, the user may be prompted to either state "yes" or "no." If the user rejects the utterance, the user may then be prompted to give the utterance again. In this way, the verifying may allow for the adjusting of the received utterance if it is not verified. Of course, any type of verification process may optionally be utilized for verifying the utterance.

Also included may be a connector (not shown) for sending and receiving data between the assembly 403 and the media player 401 as well as providing power to the media player 401. Still yet, a mounting brace 408, a front face 410, and an FM frequency display 411 may be provided.

As an option, output from the media player 401 may be sent through the assembly 403. Such output may be FM modulated with the FM transmitter 409 of the assembly 403 for reception by nearby FM receivers.

Figure 6:
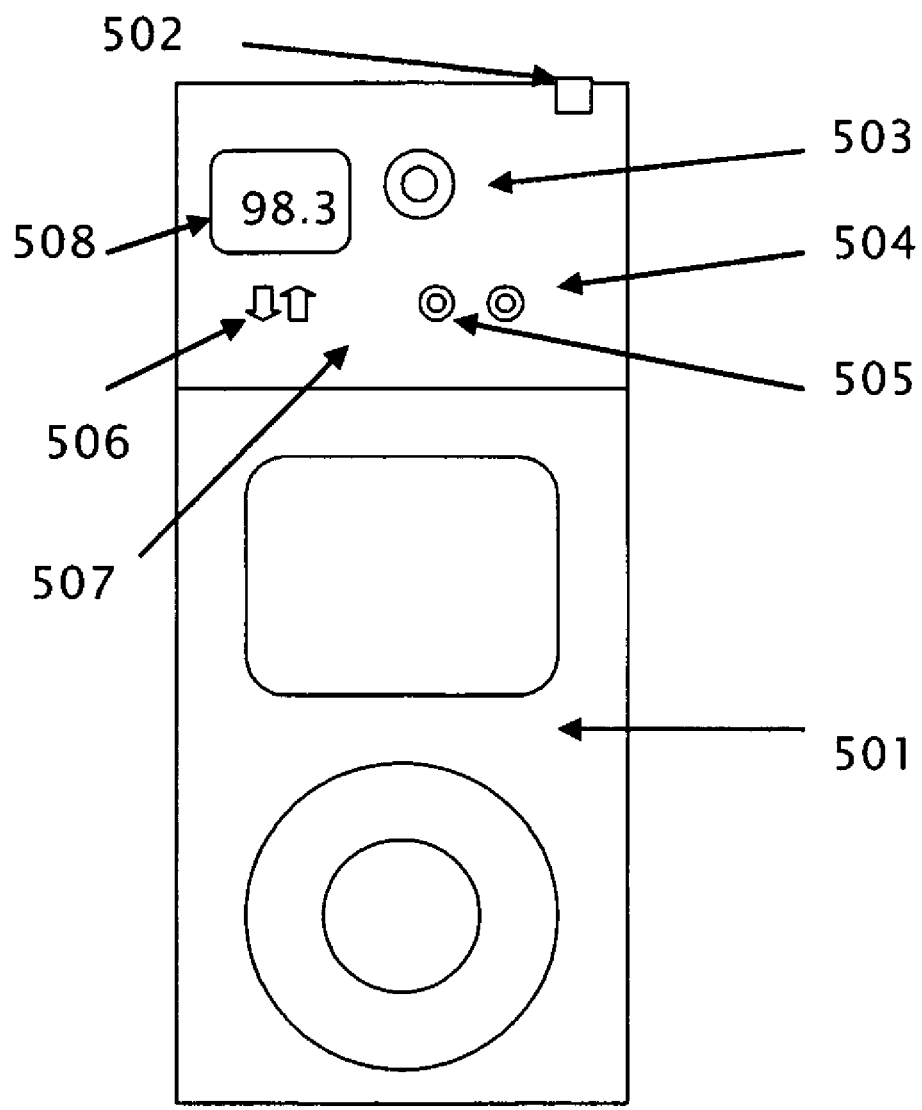
FIG. 6 shows a media player in connection with an assembly for receiving utterances, in accordance with still yet another embodiment.

FIG. 6 shows a media player in connection with an assembly for receiving utterances, in accordance with still yet another embodiment. As an option, the present media player/assembly may be implemented in the context of the architecture and environment of FIGS. 1-5. Of course, however, the media player/assembly may be implemented in any desired environment.

In the present embodiment, the assembly 507 is shown connected to a media player 501 by being mounted on top of the media player 501. Such assembly 507 may optionally include a signal line out 502, a directional or omni-directional microphone 503, a power LED 504 and listening LED 505 (which indicates whether the assembly 507 is awaiting a command—see operation 608 of FIG. 4, for example), an FM frequency adjustment 506, and/or an FM frequency display 508. Such features may include the same functionalities described with respect to FIG. 5.

Figure 7:
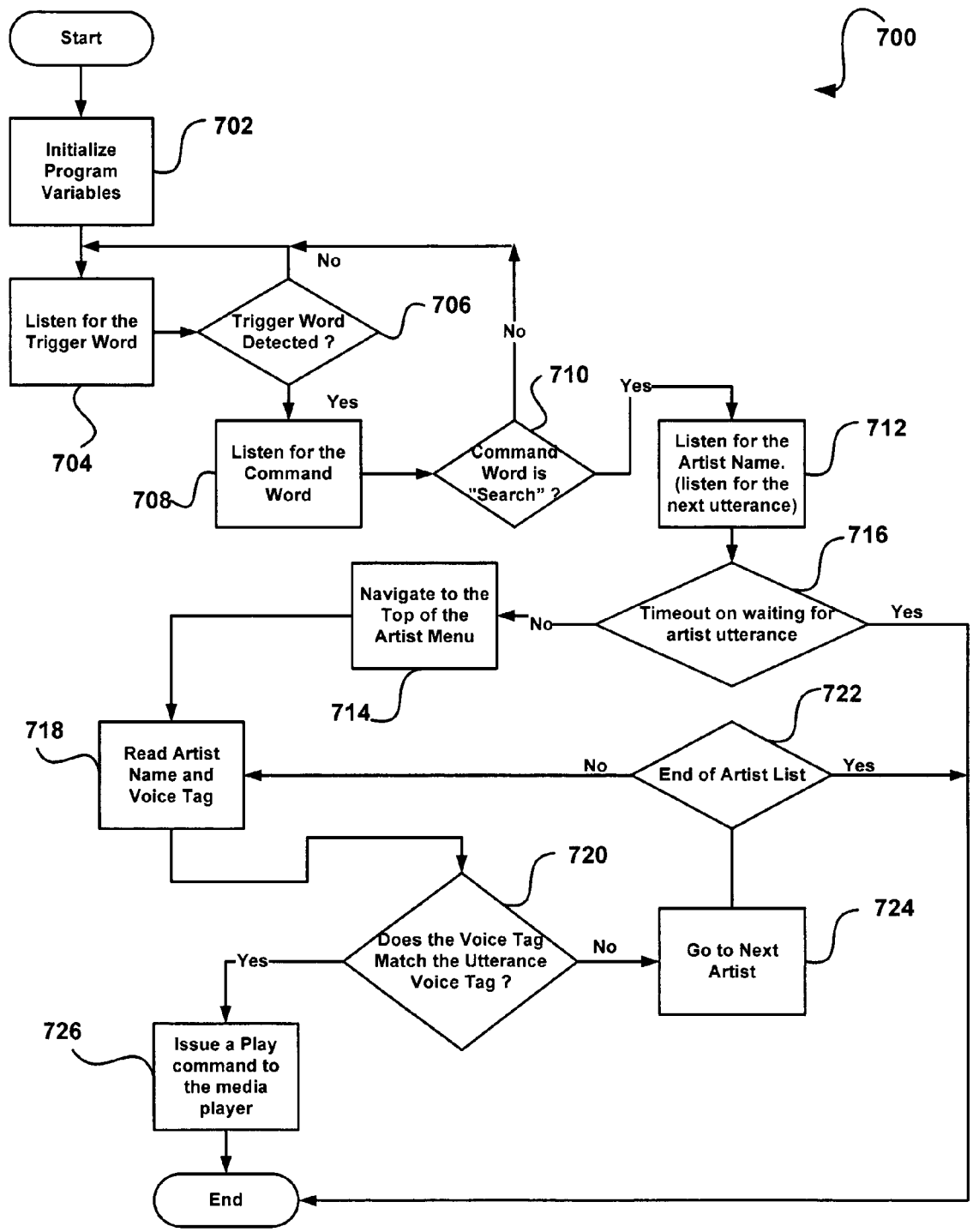
FIG. 7 shows a method for providing wireless control of a media player when a library is loaded on the media player, in accordance with one embodiment.

FIG. 7 shows a method 700 for providing wireless control of a media player when a library is loaded on the media player, in accordance with one embodiment. As an option, the present method 700 may be implemented in the context of the architecture and environment of FIGS. 1-6. Of course, however, the method 700 may be implemented in any desired environment.

First, program variables within an assembly attached to a media player (or within the media player itself) are initiated, as shown in operation 702. The program variables initialized may include initializing trigger and/or command words along with any input or output utilized. In an embodiment where a separate assembly is utilized, the assembly may, for example, include the embodiments described in FIGS. 5 and 6 above.

Next, the assembly listens for a trigger word, as in operation 704. The trigger word may be any word capable of being recognized and understood. It may also optionally be any word capable of initiating a voice recognition capability. For example, a user may be required to first say "start" in order to trigger the present embodiment.

Once it is determined that a trigger word is detected, as in decision 706, a command word is awaited, such as in operation 708. As an option, the command word may include any of the utterances described with respect to FIG. 3. Of course, the command word may include any word capable of being recognized and capable of being translated into computer code that the media player can act upon. In the present embodiment, if the command word received is "Search", as shown in decision 710, the method 700 continues to listen for a next utterance in operation 712. The next utterance may be, for example, an artist name or any other word.

As another option, a time limit (e.g. 120 seconds, etc.) may be utilized such that if no utterance is detected during operation 712 within the time limit, the method 700 may terminate, as shown in decision 716. Otherwise, if an utterance is detected during operation 712 within the time limit, the method 700 may navigate to a first item in a library of words associated with the utterance received in operation 712. In the present embodiment, and shown just by way of example, the method 700 may navigate to a first item located in an artist library, as shown in operation 714. Of course, it should be noted that any type of data capable of being located within a library may be utilized. An artist name and voice tag associated with the first item in the library may then be read, such as in operation 718, and it may be determined whether the voice tag matches the utterance received in operation 712 (see decision 720).

If the voice tag associated with the first item in the library does not match the utterance received in operation 712, the method 700 may navigate to a next item located in the artist library, as shown in operation 724. If it is determined in decision 722 that there is not a next item in the artist library to navigate to (e.g. the method 700 has reached the end of the library), the method 700 may terminate. Otherwise, the method 700 may return to operation 718 where the artist name and voice tag associated with the next item are read.

The method 700 continues until it is determined in decision 720 that the voice tag matches the utterance received in operation 712, in which case a command is issued to the media player, such as, for example, a command to play a first among a set of songs associated with the artist name received in operation 712, as shown in operation 726.

Figure 8:
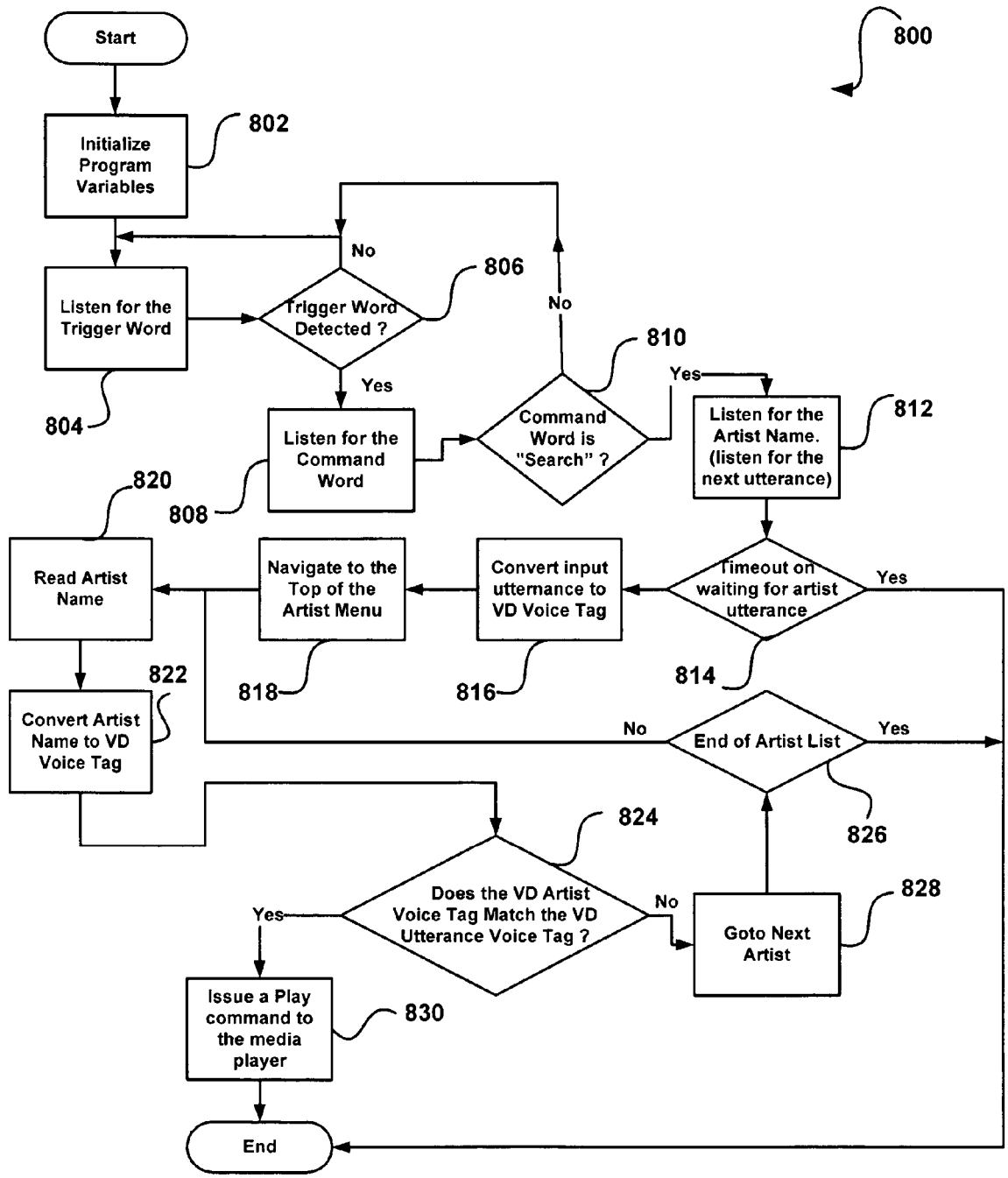
FIG. 8 shows a method for providing wireless control of a media player when a library is not loaded on the media player, in accordance with another embodiment.

FIG. 8 shows a method 800 for providing wireless control of a media player when a library is not loaded on the media player, in accordance with another embodiment. As an option, the present method 800 may be implemented in the context of the architecture and environment of FIGS. 1-6. Of course, however, the method 800 may be implemented in any desired environment.

First, program variables within an assembly attached to a media player (or within the media player itself) are initiated, as shown in operation 802. The program variables initialized may include initializing trigger and command words along with any input or output utilized. Next, the assembly listens for a trigger word, as in operation 804. The trigger word may be any word capable of being recognized and understood. It may also optionally be any word capable of initiating a voice recognition capability. For example, a user may be required to first say "start" in order to trigger the present embodiment.

Once it is determined that a trigger word is detected, as in decision 806, a command word is awaited, such as in operation 808. As an option, the command word may include any of the utterances described with respect to FIG. 3. Of course, the command word may include any word capable of being recognized and capable of being translated into computer code that the media player can act upon. In the present embodiment, if the command word received is "Search", as shown in decision 810, the method 800 continues to listen for a next utterance in operation 812. The next utterance may be, for example, an artist name or any other word associated with a file located in a library loaded on the media player. Just by way of example, the file may be a song located in a library of songs loaded on the media player. Of course, it should be noted that any type of data capable of being located within a library may be utilized.

As another option, a time limit (e.g. 120 seconds, etc.) may be utilized such that if no utterance is detected during operation 812 within the time limit, the method 800 may terminate, as shown in decision 814. Otherwise, if an utterance is detected during operation 812 within the time limit, the method 800 converts the detected utterance into an application specific voice tag, as shown in operation 816.

Next, the method 800 may navigate to a first item in a library associated with the utterance received in operation 812. In the present embodiment, and shown just by way of example, the method 800 may navigate to a first item located in an artist library as shown in operation 818. For example, an artist name associated with the first item may be read, such as in operation 820, and the artist name may be converted to an application specific voice tag (see operation 822).

It is next determined in decision 824 whether the application specific voice tag generated from the first item in the library (see operation 822) matches the application specific voice tag generated from the utterance received in operation 812 (see operation 816). If the application specific voice tag associated with the first item in the library from operation 822 does not match the application specific voice tag associated with the utterance from operation 816, the method 800 may navigate to a next item located in the library, as shown in operation 828.

If it is determined in decision 826 that there is not a next item in the library to navigate to (e.g. the method 800 has reached the end of the library), the method 800 may terminate. Otherwise, the method 800 may return to operation 820 where the artist name and voice tag associated with the next item in the artist library are read.

The method 800 continues until it is determined in decision 824 that the voice tags match, in which case a command is issued to the media player, such as, for example, a command to play a song (or set of songs) associated with the artist name received in operation 812 (as shown in operation 830).

While various embodiments have been described above, it should be understood that they have been presented by way of example only, and not limitation. For example, any of the network elements may employ any of the desired functionality set forth hereinabove. Thus, the breadth and scope of a preferred embodiment should not be limited by any of the above-described exemplary embodiments, but should be defined only in accordance with the following claims and their equivalents.

What is claimed is:

1. A system, comprising:
   an automobile;
   an assembly coupled to the automobile for receiving power therefrom and further connectable to a media player with music stored thereon, the assembly including a voice activation module, memory, a power unit for charging the media player, a speaker, and a microphone;
   said memory including a computer readable medium comprising:
   computer code for initializing a plurality of program variables stored in the memory of the assembly, the program variables including artists, songs, and playlists;
   computer code for receiving a trigger signal;
   computer code for, after the receipt of the trigger signal, receiving an utterance utilizing the microphone of the assembly;
   computer code for verifying the utterance utilizing the speaker of the assembly;
   computer code for, after the verification of the utterance, generating a corresponding command for the media player based on the utterance, the corresponding command selected from a command set including a play command, a pause command, a shuffle command, a playlist command, an artist command, and a song command; and
   computer code for channeling output of the media player via the assembly;
   wherein the corresponding command provides wireless control of the media player;
   wherein the corresponding command is sent as a bit stream with each of a plurality of bits sent every 55 uSecs.

2. The system of claim 1, wherein the assembly includes:
   an FM transmitter; and
   software capable of detecting the utterance, translating the utterance into computer code and transmitting the code to the media player.

3. The system of claim 2, wherein the computer code controls a state of the media player.

4. The system of claim 2, wherein the output is FM modulated utilizing the FM transmitter of the assembly for reception by an FM receiver.

5. The system of claim 2, wherein the FM transmitter is capable of sweeping in a range of frequencies between 88 MHz and 108 MHz.

6. The system of claim 1, wherein the assembly is releasably connected to the media player.

7. The system of claim 1, wherein the assembly includes a visual indicator for indicating whether the media player is awaiting the receipt of the utterance.

8. The system of claim 1, and further comprising computer code for adjusting the received utterance if it is not verified.

9. The system of claim 1, and further comprising computer code for translating the utterance into computer code capable of being recognized by the media player.

10. The system of claim 1, wherein the media player is selected from the group consisting of: an iPod(R) and a cell phone.

11. The system of claim 1, wherein the utterance is a programmed command that is registered by the media player.

12. The system of claim 1, wherein the command set also includes at least one of a fast forward command, a rewind command, an on command, an off command, a repeat command, search, a volume up command, a volume down command, and a next playlist command.

13. The system of claim 1, wherein the command set also includes a fast forward command, a rewind command, an on command, an off command, a repeat command, a search command, a volume up command, a volume down command, and a next playlist command.

14. The system of claim 1, wherein the utterance is converted into an application specific voice tag and is subsequently compared to at least one voice tag from a library of voice tags located on the media player.

15. A system, comprising:
   an automobile;
   an assembly coupled to the automobile for receiving power therefrom and further connectable to a media player with music stored thereon, the assembly including memory, a power source for charging the media player, a speaker, a microphone, and:

computer code for initializing a plurality of program variables stored in the memory of the assembly, the program variables including artists, songs, and playlists;

computer code for identifying a trigger signal;

computer code for, after the identification of the trigger signal, identifying an utterance received utilizing the microphone of the assembly;

computer code for verifying the utterance utilizing the speaker of the assembly; and computer code for, after the verification of the utterance, generating a corresponding command for the media player based on the utterance, the corresponding command selected from a command set including a play command, a pause command, a shuffle command, a playlist command, an artist command, and a song command;

said assembly channeling output of the media player via the assembly;

said corresponding command providing wireless control of the media player;

wherein the corresponding command is sent as a bit stream with each of a plurality of bits sent with a code repetition rate of 66.

16. The system of claim 15, wherein the corresponding command is application-specific.

17. The system of claim 15, wherein the trigger signal is audible.

18. The system of claim 17, wherein the trigger signal includes an audible trigger word.

19. The system of claim 15, wherein it is determined whether a timeout has occurred before the utterance is received.

20. The system of claim 19, wherein if the timeout has occurred, the identification of the trigger signal is repeated.

21. The system of claim 15, wherein it is determined whether the utterance is verified.

22. The system of claim 21, wherein it is determined whether the utterance is verified, based on whether the utterance is programmed.

23. The system of claim 21, wherein it is determined whether the utterance is verified, based on whether the utterance is registered.

24. The system of claim 21, wherein if the utterance is not verified, the corresponding command is not generated.

25. The system of claim 21, wherein if the utterance is not verified, the utterance is outputted via the speaker.

26. The system of claim 25, wherein a user is allowed to accept or reject the utterance outputted via the speaker.

27. The system of claim 15, wherein the program variables are initialized with at least one of input and output.

28. The system of claim 15, wherein a button release command is generated.

29. The system of claim 15, wherein the media player further includes a satellite radio player.

30. The system of claim 15, wherein the corresponding command is sent as a bit stream with each bit sent with a code repetition rate of 66.

31. The system of claim 15, wherein it is determined whether the corresponding command is a sleep command.

32. The system of claim 15, wherein the media player is powered down, if it is determined the corresponding command is a sleep command.

33. The system of claim 15, wherein the program variables are released.

34. The system of claim 15, wherein the media player includes an iPod(R).

35. The system of claim 15, wherein the command set includes a search command.

36. The system of claim 15, wherein the utterance is compared against a library of words.

37. The system of claim 36, wherein the corresponding command is generated in response to identifying a match between the utterance and the library of words.

38. The system of claim 37, wherein the library of words includes an artist name and a voice tag.

39. The system of claim 37, wherein the library of words includes an artist name and an application specific voice tag.

40. A computer program product embodied on a computer readable storage medium, comprising:

computer code for controlling an assembly coupled to an automobile for receiving power therefrom and further connectable to a media player with music stored thereon, the assembly including memory, a power source for charging the media player, a speaker, and a microphone;

computer code for initializing a plurality of program variables stored in the memory of the assembly, the program variables including artists, songs, and playlists;

computer code for identifying a trigger signal;

computer code for, after the identification of the trigger signal, identifying an utterance received utilizing the microphone of the assembly;

computer code for verifying the utterance utilizing the speaker of the assembly;

computer code for, after the verification of the utterance, generating a corresponding command for the media player based on the utterance, the corresponding command selected from a command set including a play command, a pause command, a shuffle command, a playlist command, an artist command, and a song command; and computer code for controlling the assembly such that output of the media player is channeled via the assembly, and the corresponding command provides wireless control of the media player;

wherein the corresponding command is at least one of 1) sent as a bit stream with each of a plurality of bits sent every 55 uSecs, and 2) sent as a bit stream with each of a plurality of bits sent with a code repetition rate of 66.

41. The computer program product of claim 40, wherein the corresponding command is application-specific.

42. The computer program product of claim 40, wherein the trigger signal is audible.

43. The computer program product of claim 42, wherein the trigger signal includes an audible trigger word.

44. The computer program product of claim 40, wherein it is determined whether a timeout has occurred before the utterance is received.

45. The computer program product of claim 44, wherein if the timeout has occurred, the identification of the trigger signal is repeated.

46. The computer program product of claim 40, wherein it is determined whether the utterance is verified.

47. The computer program product of claim 46, wherein it is determined whether the utterance is verified, based on whether the utterance is programmed.

48. The computer program product of claim 46, wherein it is determined whether the utterance is verified, based on whether the utterance is registered.

49. The computer program product of claim 46, wherein if the utterance is not verified, the corresponding command is not generated.

50. The computer program product of claim 46, wherein if the utterance is not verified, the utterance is outputted via the speaker.

51. The computer program product of claim 50, wherein a user is allowed to accept or reject the utterance outputted via the speaker.

52. The computer program product of claim 50, wherein the program variables are initialized with at least one of input and output.

53. The computer program product of claim 40, wherein a button release command is generated.

54. The computer program product of claim 40, wherein the command set includes a search command.

55. The computer program product of claim 40, wherein the utterance is compared against a library of words.

56. The computer program product of claim 55, wherein the corresponding command is generated in response to identifying a match between the utterance and the library of words.

57. The computer program product of claim 55, wherein the library of words includes an artist name and a voice tag.

58. The computer program product of claim 55, wherein the library of words includes an artist name and an application specific voice tag.

59. The computer program product of claim 40, and further comprising computer code for translating the utterance into computer code capable of being recognized by the media player.

60. The computer program product of claim 40, wherein the utterance is a programmed command that is registered by the media player.

61. The computer program product of claim 40, wherein the command set also includes at least one of a fast forward command, a rewind command, an on command, an off command, a repeat command, search, a volume up command, a volume down command, and a next playlist command.

62. The computer program product of claim 40, wherein the command set also includes a fast forward command, a rewind command, an on command, an off command, a repeat command, a search command, a volume up command, a volume down command, and a next playlist command.

63. The computer program product of claim 44, wherein the utterance is converted into an application specific voice tag and is subsequently compared to at least one voice tag from a library of voice tags located on the media player.

* * * * *